United States Patent [19]

Papp et al.

[11] 4,243,936

[45] Jan. 6, 1981

[54] METHOD FOR MAGNETO-OPTICAL CURRENT MEASUREMENTS

[75] Inventors: Alfred Papp; Hauke Harms, both of Munich, Fed. Rep. of Germany

[73] Assignee: Siemens Aktiengesellschaft, Berlin and Munich, Fed. Rep. of Germany

[21] Appl. No.: 970,218

[22] Filed: Dec. 18, 1978

[30] Foreign Application Priority Data

Dec. 29, 1977 [DE] Fed. Rep. of Germany ....... 2758723

[51] Int. Cl.² .................. G01R 31/02; G01R 33/02
[52] U.S. Cl. .................. 324/96; 324/117 R; 324/244
[58] Field of Search .......... 324/96, 117 R, 127, 324/244; 350/150

[56] References Cited

U.S. PATENT DOCUMENTS 2,877,308  3/1959  Reiner et al. ................ 330/9
3,629,703  12/1971  Bernard ...................... 324/96

OTHER PUBLICATIONS

Rogers, A. J., "Optical Methods . . . ," A.I.M. Liege, Traitment des Donnes, 1977, pp. 6-1 to 6-12.

Primary Examiner—Ernest F. Karlsen
Attorney, Agent, or Firm—Kenyon & Kenyon

[57] ABSTRACT

A method is described for magneto-optical current measurements using a linearly polarized light beam in which the light beam is alternatingly polarized by polarization modulation at a given frequency in two orthogonal directions and the intensities of two signals corresponding to the two states of polarization are picked up sequentially at the frequency of the modulating signal and are processed simultaneously, eliminating the noise component of the measurement signal. The method is particularly useful for the measurement of currents in high voltage systems.

2 Claims, 3 Drawing Figures

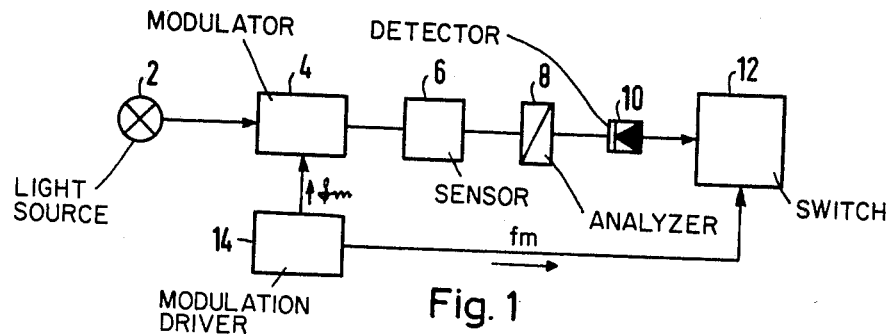
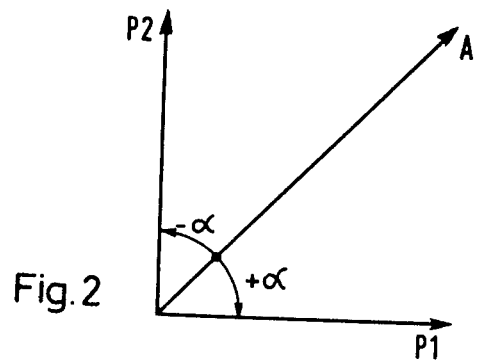
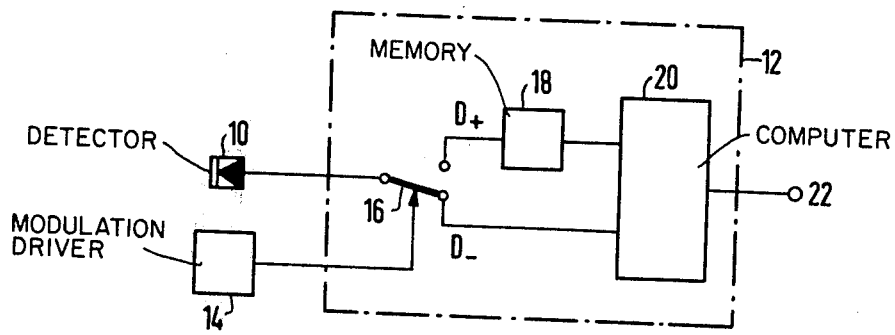

METHOD FOR MAGNETO-OPTICAL CURRENT MEASUREMENTS

BACKGROUND OF THE INVENTION (a) Field of the Invention

This invention relates to a method for the magneto-optical measurement of currents by means of a linearly polarized light beam, the plane of polarization of which is rotated as a function of the magnitude of the current to be measured, and by means of a modulation signal which is superimposed on the measurement.

(b) Description of the Prior Art

Devices for measuring currents in high voltage conductors and for measuring large AC currents with a DC component are known in which a light beam is fed via a polarizer, a magneto-optical measuring sensor, and an analyzer to a detector followed by electronic circuitry. The plane of polarization of the light beam is subjected to a rotation corresponding to the magnitude of the current in the measuring sensor which is influenced by the magnetic field of the current to be measured. In an evaluator arranged at low voltage potential, the magnitude of the rotation is converted, in an analyzer, into a signal of corresponding intensity which can be picked up by the photo detector. The output signal of the detector is processed in the electronic circuitry.

In one known arrangement, the evaluator contains an analyzer in which the polarized light coming from the measuring sensor, preferably a laser beam, is split into two partial light beams, the planes of polarization of which are orthogonal and which change their intensity in opposite directions with the angle of rotation of the polarization of the incident beam. Each of the partial light beams is fed to a detector, preferably a semiconductor photo diode, the outputs of which are fed to a differential amplifier. The difference voltage serves as a measure for the Faraday rotation of the measurement signal. Although, in theory, noise components of the measurement signal caused by intensity variations of the light beam can be eliminated by this differential method, it is unavoidable in practise that there should be local variation of the laser beams on the semi-conductor photo diodes. Since the photo sensitivity of these diodes is location dependent, beam displacements of a few μm can cause signal variations of up to several percent. In addition, such photo diodes exhibit a small spread in sensitivity from unit to unit. The detectors associated with the two partial beams therefore furnish different signal variations which cannot be eliminated by this method.

Another known method (Rogers in "Optical Methods for Measurement of Voltage and Current at High Voltage", A.I.M., Liege, Traitment des données-1977, page 6, paragraph 3.2(c), Intensity Distribution Noise) uses a modulated light beam which is fed via the measuring sensor and an analyzer to a single photo diode, the output signal of which is processed in an electronic circuit. The detector measures the intensity of the arriving measurement signal, which also contains the superimposed modulation signal. The demodulation takes place in the connected electronic circuitry. The intensity is influenced by the Faraday rotation in the measuring sensor as well as by the noise components mentioned. With this measuring method, both intensity components can be separated from each other and the noise component on the measurement signal is suppressed. The linearity between the useful and the measurement signal, however, is sufficient only at small angles of rotation of up to about 2°. At larger angles of rotation with a correspondingly larger signal to noise ratio, a non-linearity which depends on the signal amplitude is noticeable.

It is an object of the present invention to describe a very accurate method of measurement having a measuring error of, for instance, less than 0.2%, which allows a substantially larger rotation of the plane of polarization.

SUMMARY OF THE INVENTION

According to the invention, this problem is solved in a method of the kind mentioned above by providing for alternate switching of the light beam by polarization modulation at a given frequency into two orthogonal directions of polarization and for feeding the intensity signals along with the frequency of the modulation signal corresponding to the two states of polarization electronically to separate channels for processing. The frequency of the modulation signal, which is preferably a square wave is at least one and, preferably, two orders of magnitude higher than the frequency of the measurement signal. The direction of polarization is switched back and forth at the modulation frequency between the two orthogonal directions of polarization which enclose a positive and negative angle, respectively, of 45° relative to the pass direction of the analyzer. The detector measures these two separate states of polarization sequentially in time together with the Faraday rotation measurement signal, and they are simultaneously processed in electronic circuitry connected thereto. Since the modulation frequency is substantially higher than the signal frequency, i.e., the frequency of the current to be measured, usually 50 Hz, as well as the frequencies of the noise components, the measurement signal can be reproduced electronically with sufficient accuracy and the noise component in the measurement signal can be eliminated simultaneously. This elimination is accomplished by forming the quotient of the difference and the sum of the intensities of the states of polarization received sequentially in time.

In this method, the modulation signal serves only for producing the states of polarization in the modulator. It does not appear in the electronic circuitry and, accordingly, there is no need for demodulation in the electronic circuitry.

BRIEF DESCRIPTION OF THE DRAWINGS

FIG. 1 is a block diagram of an apparatus useful for implementing the method of the invention.

FIG. 2 shows the relationship of the two directions of polarization relative to the analyzer.

FIG. 3 illustrates an embodiment of an electronic circuit useful in performing the method of the invention.

DETAILED DESCRIPTION OF THE INVENTION

In FIG. 1, there are shown a source of radiation 2, a modulator 4, a measuring sensor 6, an analyzer 8 and a detector 10. The detector 10 is followed by an electronic circuit 12. Also provided is a modulation driver 14 for modulator 4 and electronic circuit 12. The radiation source 2 furnishes a beam, not specifically designated, of polarized light, preferably a laser beam, the direction of modulation of which is rotated back and forth in the modulator 4 between the two directions of polarization which include an angle of 90° at a high frequency $f_m$ which for a measurement signal of 50 Hz, can preferably be between about 10 to 100 kHz and in particular, about 50 kHz.

The modulator 4 is preferably an electro-optical modulator which contains a birefringent electro-optical crystal which can be changed by the application of a voltage. The control voltages required for the switching are provided by the modulator driver 14 which also drives the electronic circuit 12 at the same frequency to cause the output signal of the detector 10 to be deflected into two separate channels at the modulation frequency.

In an alternative embodiment, a magneto-optical modulator may be used to rotate the phase. For polarizing the light beam, a polarizer, not shown in the drawing, may precede the modulator 4 when the radiation source 2 does not furnish linearly polarized light.

The measuring sensor 6 rotates the direction of polarization additionally as a function of the magnitude of the magnetic field surrounding an electric conductor, not shown, the current in which is to be measured. The sensor may comprise a monomode light guide fiber which is looped around the conductor and has a light source and a return to the analyzer. The analyzer 8 converts the change in polarization into a corresponding intensity change which is picked up by the detector 10 connected thereto. Detector 10 is preferably a semiconductor diode; it may also be, for example, a photo multiplier. The detector 10 delivers an electrical signal D corresponding to the intensity of the radiation received.

With an angle $\alpha$ between the direction of polarization of the light beam and the pass direction of the analyzer 8, the detector signal is $$D = p(t).I(t) \cos^2(\alpha + F(t))$$

where p(t) is the sensitivity of the photo diode, I(t) is the intensity of the light beam, and F(t) is the Faraday rotation measurement signal. Around $\alpha = \pm 45°$, the relationship between the detector signal D and the Faraday rotation measurement signal F(t) is linear. At these angular positions between the polarizer and the analyzer, the measuring system therefore has its greatest sensitivity. Then we have for $\alpha = +45°$ $$D = (\tfrac{1}{2}) p(t).I(t) (1 - \sin 2F(t))$$

and for $\alpha = -45°$ $$D_+^- = (\tfrac{1}{2}) p(t).I(t) (1 + \sin 2F(t)).$$

If, in accordance with FIG. 2, the two orthogonal directions of polarization P1 and P2 in the modulator 4 are chosen so that they include with the pass direction A of the analyzer 8 an angle $+\alpha$ and $-\alpha$, respectively, and if the modulation frequency $f_m$ is very much higher than the signal frequency as well as the frequencies of the noise components, then the sum $$D_+ + D_- p(t).I(t)$$

furnishes the pure noise factor of the measurement signal. In the electronic circuit 12, the detector signals $D_+$ and $D_-$, which are delivered by the detector 10 alternatingly and sequentially in time, are conducted alternatingly to two different signal paths at the modulation frequency $f_m$ given by the control unit 14.

For this purpose the output signal of the detector 10 is fed alternatingly at the frequency $f_m$ of the modulation signal to an electronic memory 18 (FIG. 3) or an electronic computer 20 via an electronic snap switch 16 shown simply in FIG. 3 as a double throw contact. The snap switch 16 is driven by the modulator driver 14 in phase at the modulation frequency $f_m$. The memory 18 stores the detector signal corresponding to the intensity $D_+$ according to the sample-and-hold principle and delivers it during the next half-wave of the modulation frequency $f_m$ to the computer 20 when, after the snap switch 16 has switched over, the detector signal $D_-$ is being fed directly to the computer 20.

Subsequently, the quotient of the difference and the sum of the detector $D_+$ and $D_-$ is formed in the computer module 20; the sum may be produced by an operational amplifier and the difference by a two quadrant analog divider. One then obtains:

$$(D_+ - D_-)/(D_+ + D_-) = \sin 2F(t).$$

At the output 22 of the electronic circuit 12, the measurement signal sin 2F(t) is therefore obtained without noise component. It can be linearized, for instance, in a so-called arcsin module. Instead of the quotient $(D_+ - D_-)/(D_+ + D_-)$, the quotient $D_+/(D_+ + D_-) = 1 + \sin 2F(t)$ or correspondingly also $D_-/(D_+ + D_-) = 1 - \sin 2F(t)$ can also be formed in the electronic circuit 12. In such cases, the constant factor 1 is electronically filtered from the measurement signal.

The modulation signal is preferably of an at least approximately square wave shape. In this way enough time is provided during the individual polarization states for the electronic circuit 12 to measure and record. However, a half-wave modulation signal with a flat crest, or a trapezoidal signal or, under some circumstances, a sinoidal waveform can be used, at the crests of which the measurement takes place.

What is claimed is:

1. In a method for the magneto-optical measurement of currents which includes the step of rotating the plane of polarization of a linearly polarized light beam in dependence on the current to be measured, there being a modulation signal superimposed on the measurement signal, the improvement comprising the steps of:

switching the light beam in alternation, by polarization modulation at the frequency of the modulation signal, to each of two orthogonal directions of polarization, detecting, and the intensity signal associated with each direction of polarization and sequentially directing the resulting signals into separate electronic channels at the frequency of the modulation signal, and combining the separate electronic signals to eliminate the noise component of the measurement signal.

2. The method of claim 1, in which the electronic signals are combined by storing one signal and forming, with it and the other sequential intensity signal, the quotient of the difference and the sum of the intensity signals.

* * * * *